United States Patent [19]

Lemche

[11] Patent Number: 4,567,336
[45] Date of Patent: Jan. 28, 1986

[54] LOCKING MECHANISM FOR A BIPARTITE KEYBOARD HOUSING

[75] Inventor: Josef Lemche, Munich, Fed. Rep. of Germany

[73] Assignee: Siemens Aktiengesellschaft, Berlin & Munich, Fed. Rep. of Germany

[21] Appl. No.: 612,410

[22] Filed: May 21, 1984

[30] Foreign Application Priority Data

May 27, 1983 [DE] Fed. Rep. of Germany ....... 3319334

[51] Int. Cl.[4] .............................................. H01H 9/02
[52] U.S. Cl. ............................. 200/305; 174/35 GC; 292/162
[58] Field of Search ............................... 200/305, 303; 174/35 GC; 220/324, 284; 292/157, 162, DIG. 68

[56] References Cited

U.S. PATENT DOCUMENTS 2,380,782  7/1945  Owens .................................. 292/162

FOREIGN PATENT DOCUMENTS 1187950  2/1965  Fed. Rep. of Germany ...... 292/162
1321140  6/1973  United Kingdom .......... 174/35 GC Primary Examiner—Stephen Marcus
Assistant Examiner—Renee S. Kidorf
Attorney, Agent, or Firm—Hill, Van Santen, Steadman & Simpson

[57] ABSTRACT

A locking mechanism for a bipartite keyboard housing the lower part of the keyboard has clearances at at least one side, preferably at the front side, hooks secured to the upper part of the keyboard extending into the clearances. A lock rail is displaceably disposed in a channel communicating with the clearances, being provided with obliquely upwardly bent contact tongues at the spacing of the hooks and with contact humps. A web is situated in the middle of the sides of the lower part of the keyboard, preferably at the front side, and an opening is situated in the lock rail, these being aligned with one another such that the lock rail is displaceable by means of a tool.

4 Claims, 4 Drawing Figures

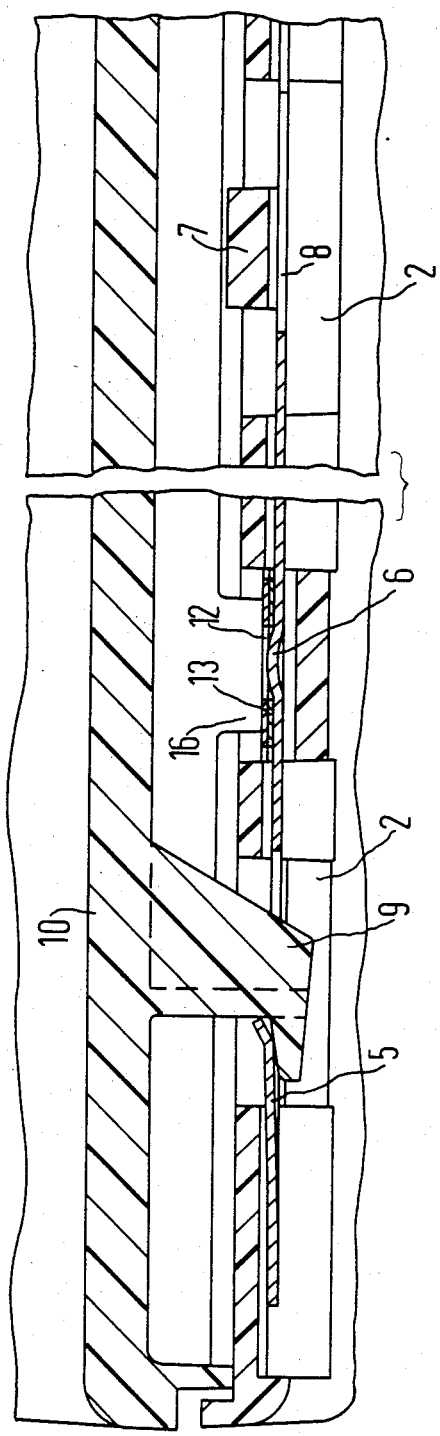
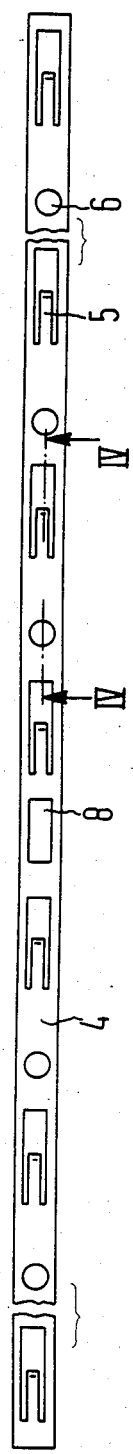
FIG 2
FIG 3

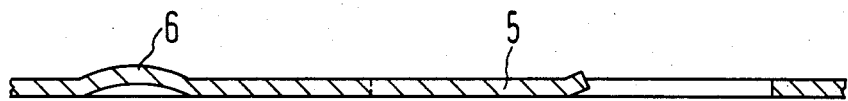
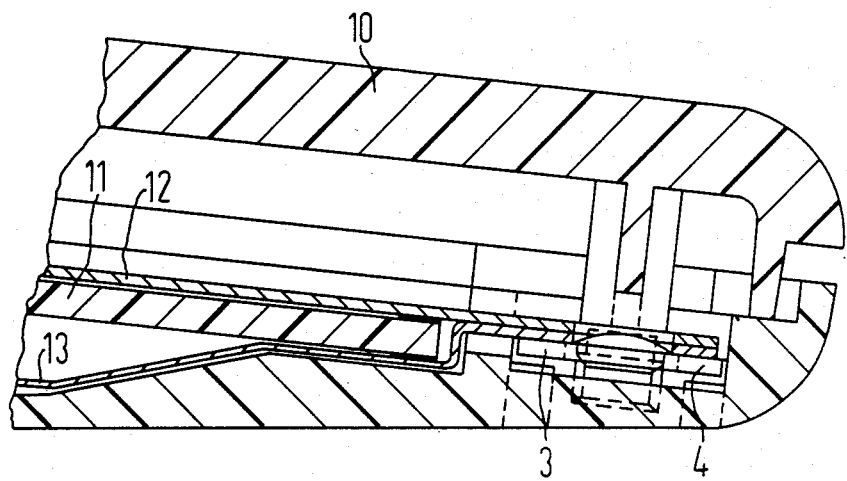

LOCKING MECHANISM FOR A BIPARTITE KEYBOARD HOUSING

BACKGROUND OF THE INVENTION

1. Field of the Invention

The invention relates to a locking mechanism for a bipartite keyboard housing consisting of plastic with an inwardly disposed shielding.

2. Description of the Prior Art

Keyboard housings are generally fabricated in sheet metal or metal spray process technology with a lacquered surface. These housings have a high shielding quality. Plastic housing with metal sputtering can only meet the demand of a high shielding quality with great outlay, namely usually with screws and sheet metal inserts. These solutions, however, are extremely involved.

SUMMARY OF THE INVENTION

An object of the present invention is to provide a locking mechanism for plastic keyboard housings which also has a good shielding effect.

A locking mechanism incorporating the principles of the present invention is designed such that the lower part of the keyboard housing includes clearances or openings at at least one side, preferably at the front side, with hooks engaging at the upper part of the keyboard housing being secured in the clearances. A lock rail is displaceably disposed below the clearances in a guide channel, the lock rail being provided with upwardly bent contact tongues at the spacing of the hooks and with contact humps therebetween. A web is situated in the center of the sides of the lower part of the keyboard, preferably at the front side, and an opening is provided in the lock rail, these being aligned with one another such that the lock rail is displaceable by means of a tool. As an example, the lock rail can be fabricated of a resilient metal material such as hoop-steel.

The insides of the upper and lower part of the keyboard are metallized or, should higher shielding quality demands exist, are provided with inserted shielding plates.

As a result of these measures a bipartite keyboard housing consisting of plastic is provided that can be opened and loosened without screws. Since the locking of the keyboard housing results in simultaneously the inter-connection of the shield, a shielding effect comparable to that of standard sheet metal housings is also provided. Cold extrusion of the plastic is thereby avoided.

BRIEF DESCRIPTION OF THE DRAWINGS

The invention shall be explained in greater detail with reference to the exemplary embodiments according to FIGS. 1 through 5. Shown are:

FIG. 2 is a partial side sectional view through the keyboard housing.

FIG. 3 is a top plan view of the lock rail.

FIG. 4 is a partial side sectional view through the lock rail taken generally along the lines IV—IV in FIG. 3.

FIG. 5 is a partial side sectional view taken in the area designated in FIG. 1.

DESCRIPTION OF THE PREFERRED EMBODIMENTS

Figure 1:
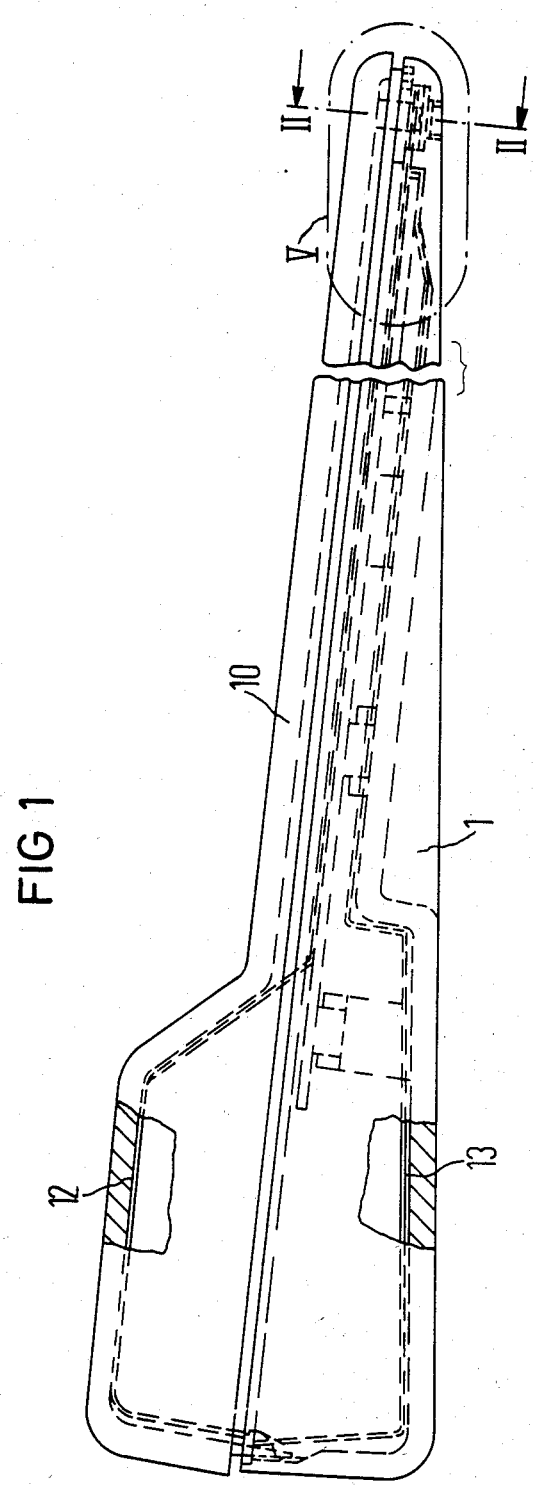
FIG. 1 is a side view of a keyboard housing.

FIG. 1 shows the side view of a keyboard housing which comprises a lower part 1 and a upper part 10 that are connected to one another. A card module 11 necessary for the electrical function is mounted in the inside of the keyboard housing; a key field (not shown) is situated at the top side of the keyboard housing. The connection of the upper part 10 and the lower part 1 of the keyboard housing is inventively accomplished by means of a locking mechanism that is shown in the figures extending along the front long side of the keyboard housing.

The locking mechanism shall be explained below with reference to FIGS. 2–5. Clearances or openings 2 are disposed at the lower part 1 of the keyboard to communicate with a guide channel 3. An elongated lock rail 4 having contact tongues 5 and contact humps 6 is slidably retained the guide channel 3. This lock rail 4 is shown in greater detail in FIG. 3. The contact tongues 5 are bent obliquely up at spaced locations to engage with hooks 9 which are formed as part of the upper part 10 of the keyboard housing. FIG. 4 shows an enlarged illustration of the lock rail 4 with the bent contact tongues 5 and the contact humps 6. In a preferred embodiment, the lock rail 4 may be fabricated of a resilient metal material such as hoop-steel or similar material.

A web 7 is situated in the middle of the lower part 1 of the keyboard and an opening 8 is provided in the lock rail 4, these being aligned with one another such that the lock rail 4 can be moved longitudinally within the channel 3 by means of a tool, such as a screw driver which can be wedged between the web 7 and a side of the opening 8 and then pivoted or twisted to cause the rail to slide in the channel 3. The contact tongues 5 and the contact humps 6 are simultaneously moved when opening or closing the housing. As is readily apparent, this lock rail can also be provided on two sides or on all sides of the keyboard. When utilizing only a single-sided locking of the keyboard, the remaining three sides are sealed by means of overlap of the upper part 10 of the keyboard and of the lower part 1 of the keyboard and by means of defined contact locations for static discharge as well as electromechanical compatiability.

In the closed condition of the keyboard, the contact tongues 5, as shown in FIG. 2 engage into the hooks 9 that are, for example, formed as a part of the upper part 10 of the keyboard. Clearances are provided adjacent the tongues 5 to allow for movement of the rail 4 to permit insertion or removal of the hooks. For normal shielding purposes in keyboards, the upper and lower parts 1, 10 are inwardly metallized. The contacting then is provided by means of the contact tongues 5 and the hooks 9.

When shielding for higher demands such as, for example, static discharge is required, the card module 11 is embedded in two shieldingg plates 12 and 13, as shown in FIG. 5, so that a Faraday cage is created. The mutual contacting of the shielding plates 12 and 13 and the contacting of the card module 11 is ensured by the contact humps 6 which press the plates 12 and 13 together against and an abutment 16 formed in the upper part 10 of the housing.

As is apparent from the foregoing specification, the invention is susceptible of being embodied with various alterations and modifications which may differ particularly from those that have been described in the preceeding specification and description. It should be understood that we wish to embody within the scope of the patent warranted hereon all such modifications as reasonably and properly come within the scope of our contribution to the art.

I claim:

1. A locking mechanism for a bipartite keyboard housing consisting of upper and lower plastic parts having inwardly disposed shielding, comprising:

an elongated guide channel formed along at least one side of the lower part, spaced clearances formed in said one side of the lower part to communicate with said channel, spaced hooks secured to the upper part of the housing extendable into said clearances, a lock rail disposed in said guide channel, said lock rail being longitudinally displaceable therein and being provided with upwardly bent contact tongues spaced to engage said hooks and with upwardly extending contact humps therebetween, a web positioned above said channel and aligned with one of said clearaces in the lower part of the keyboard, and an opening situated in the lock rail, the web and the opening being aligned with one another such that the lock rail is longitudinally displaceable by means of a tool engageable with said web against said opening.

2. The locking mechanism according to claim 1, wherein said lock rail consists of a resilient metal material.

3. The locking mechanism according to claim 1 wherein said upper and lower part of the keyboard are provided with a metallized interior surface.

4. The locking device according to claim 3 including shielding plates inserted on the insides of the upper and lower part of the keyboard.

* * * * *